(12) United States Patent
Barfield

(10) Patent No.: US 10,060,984 B2
(45) Date of Patent: Aug. 28, 2018

(54) BATTERY MANAGEMENT SYSTEMS AND METHODS

(71) Applicant: GENERAL ELECTRIC COMPANY, Schenectady, NY (US)

(72) Inventor: Kenneth Barfield, Glenville, NY (US)

(73) Assignee: General Electric Company, Schenectady, NY (US)

( * ) Notice: Subject to any disclaimer, the term of this patent is extended or adjusted under 35 U.S.C. 154(b) by 1059 days.

(21) Appl. No.: 14/070,505

(22) Filed: Nov. 2, 2013

(65) Prior Publication Data

US 2014/0124498 A1    May 8, 2014

Related U.S. Application Data

(60) Provisional application No. 61/721,712, filed on Nov. 2, 2012.

(51) Int. Cl.
| | | |
|---|---|---|
| H05B 1/02 | (2006.01) | |
| G01K 7/00 | (2006.01) | |
| H01C 3/04 | (2006.01) | |
| G01R 31/36 | (2006.01) | |
| G01R 19/00 | (2006.01) | |
| H02J 7/00 | (2006.01) | |
| H01M 10/637 | (2014.01) | |

(52) U.S. Cl.
CPC ......... G01R 31/3606 (2013.01); G01R 19/00 (2013.01); H02J 7/0029 (2013.01); H02J 7/0091 (2013.01); H01M 10/637 (2015.04)

(58) Field of Classification Search
CPC .............. G01R 19/00; G01R 31/3606; G01R 19/0023; G01R 19/0038; G01R 19/16542; H01M 10/637; H02J 7/0029; H05B 1/02; G01K 7/00; G01K 7/22; H01C 3/04
USPC ......... 219/497, 505, 506; 374/185, 100, 173
See application file for complete search history.

(56) References Cited

U.S. PATENT DOCUMENTS

| | | | | |
|---|---|---|---|---|
| 1,687,196 | A * | 10/1928 | Daellenbach | H05B 3/00 219/209 |
| 3,599,864 | A * | 8/1971 | Liddle | G05B 11/28 219/492 |
| 5,504,306 | A * | 4/1996 | Russell | F24H 9/2028 219/481 |
| 6,014,082 | A * | 1/2000 | Knutson | C23C 16/46 118/666 |
| 2005/0052274 | A1* | 3/2005 | Mattoon | G01K 1/026 338/25 |
| 2009/0122834 | A1* | 5/2009 | Wang | G01K 7/21 374/185 |
| 2010/0145652 | A1* | 6/2010 | Casasso | G01K 7/20 702/130 |

* cited by examiner

Primary Examiner — Michael G Hoang
(74) Attorney, Agent, or Firm — Dority & Manning, P.A.

(57) ABSTRACT

A battery management system comprises a circuit for controlling a heating component for a battery to prevent overheating of the battery. The circuit can include an RTD, a primary resistor and a secondary resistor, wherein respective reference voltages are compared to generate a signal. The signal can be filtered and converted to a digital signal for use to by a software programmable processing device (SPPD) to control a temperature of the battery via the heating component. Further, a method is provided that allows hardware only comparison of the nonlinear temperature representation to a fixed set point.

17 Claims, 13 Drawing Sheets

BATTERY MANAGEMENT SYSTEMS AND METHODS

CROSS-REFERENCE TO RELATED APPLICATIONS

This application claims the benefit of U.S. Provisional Patent Application No. 61/721,712, filed on Nov. 2, 2012, entitled "Battery Management Systems and Methods" which is herein incorporated by reference in its entirety.

TECHNICAL FIELD

Embodiments of the subject matter disclosed herein relate to battery management circuitry designs.

BACKGROUND

Battery management systems can include various components, circuitry, hardware, and the like. For instance, a circuit can be utilized to engage and/or disengage a contactor or relay. Yet, conventional techniques often include costly components or circuitry and lack response time for opening or closing the contactor or relay. Additionally, battery management systems can include a temperature sensing device. Conventional circuits or components include costly linear devices that detect a temperature. Battery management systems can include isolating circuits or components that eliminate noise or interference from a transmission point to a reception point.

It may be desirable to have a system and method that differs from those systems and methods that are currently available.

BRIEF DESCRIPTION

In an embodiment, a sensing circuit comprises a first circuit, a second circuit, and an amplification circuit. The first circuit is configured to receive a reference voltage. The second circuit is configured to receive a resistance temperature detection (RTD) wire voltage. The amplification circuit is configured to produce an analog output signal based at least in part on the reference voltage and the RTD wire voltage. The sensing circuit further comprises an analog-to-digital converter (ADC) device that is configured to convert the analog output signal to a digital signal output, and a processor configured to process the digital signal and control a thermal control unit of a battery (e.g., control may be based on the digital signal as processed).

In an embodiment, a sensing circuit comprises a resistance temperature detection (RTD) unit, a primary voltage resistor coupled with the RTD unit and configured to receive a reference voltage, a secondary voltage resistor configured to receive an RTD wire voltage from an RTD wire and that is coupled with the resistance temperature detection (RTD) unit, and a gain resistor configured to receive a secondary voltage value from the secondary voltage resistor and coupled to the secondary voltage resistor and an operational amplifier.

In an embodiment, a system comprises a reference voltage source configured to provide a filtered reference voltage signal, and a differential circuit having two inputs configured to be electrically connected to a resistance temperature detector (RTD). The differential circuit is operatively connected to the reference voltage source and has an RTD output configured to provide an RTD output signal represented by a voltage value when connected to the RTD.

In an embodiment, a system is provided for determining a temperature experienced by a resistance temperature detector (RTD). The system includes a reference voltage source configured to provide a filtered reference voltage signal. The system further includes a differential circuit having two inputs configured to be electrically connected to the resistance temperature detector, wherein the differential circuit is operatively connected to the reference voltage source and has a RTD output configured to provide a RTD output signal when connected to the RTD. Normally a differential circuit operates linearly. This differential circuit is effectively non-linear due to the RTD output being non-linear. This complete differential circuit, including the RTD, produces a nonlinear transfer function due to the action of the RTD itself. The RTD's resistance changes with temperature, which changes the resistance of the circuit's input resistance network seen by the amplifier. The effective gain of the differential circuit is a function of RTD temperature, effectively causing the nonlinear characteristics. The system may further include a software programmable processing device configured to receive the filtered reference voltage and the RTD output signal, and programmed to convert the filtered reference voltage signal and the RTD output signal to a temperature signal accurately representing the temperature experienced by the RTD.

In an embodiment, a method is provided that includes exposing a RTD to an environment with a temperature, filtering a reference voltage source to create a filtered reference voltage signal, combining the RTD and reference with a difference amplifier generating a RTD output signal with non-linear characteristics, receiving the filtered reference voltage signal and the RTD output signal, and converting the RTD output signal and the filtered reference voltage signal to a temperature signal representative of the temperature of the environment.

In an embodiment, a method is provided that allows hardware only comparison of the nonlinear temperature representation to a fixed set point. This comparison can be made to an arbitrary number of nonlinear RTD output voltages simultaneously. Making this comparison in hardware rather than through software is required for many systems that must have reliability higher than microprocessor and software systems typically have. In battery systems this multi-channel comparison to a set point can be used as an over temperature shutdown function.

BRIEF DESCRIPTION OF THE DRAWINGS

With reference to the drawings, like reference numerals designate identical or corresponding parts throughout the several views. However, the inclusion of like elements in different views does not mean a given embodiment necessarily includes such elements or that all embodiments include such elements.

DETAILED DESCRIPTION

Figure 1:
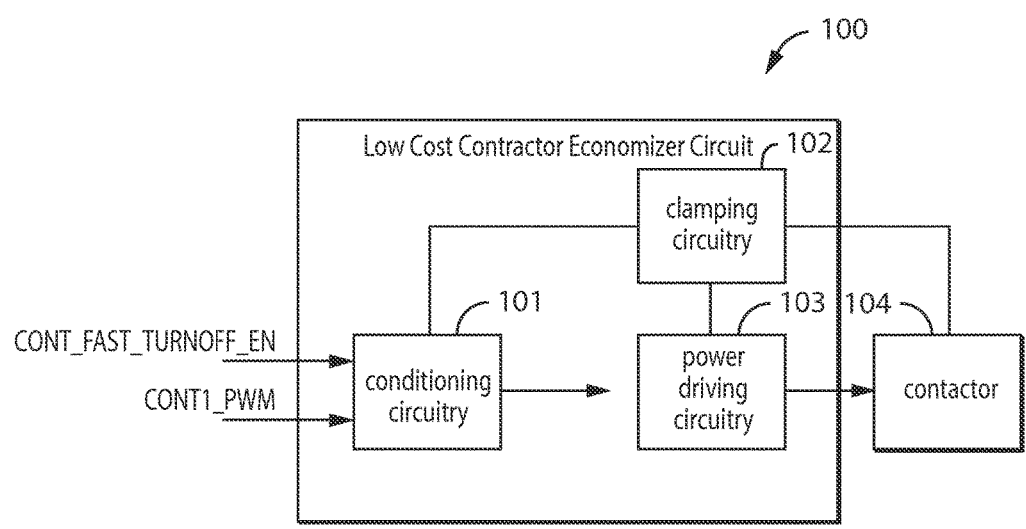
FIG. 1 is an illustration of a block diagram of an embodiment of a system for controlling a contactor or relay.
Figure 2:
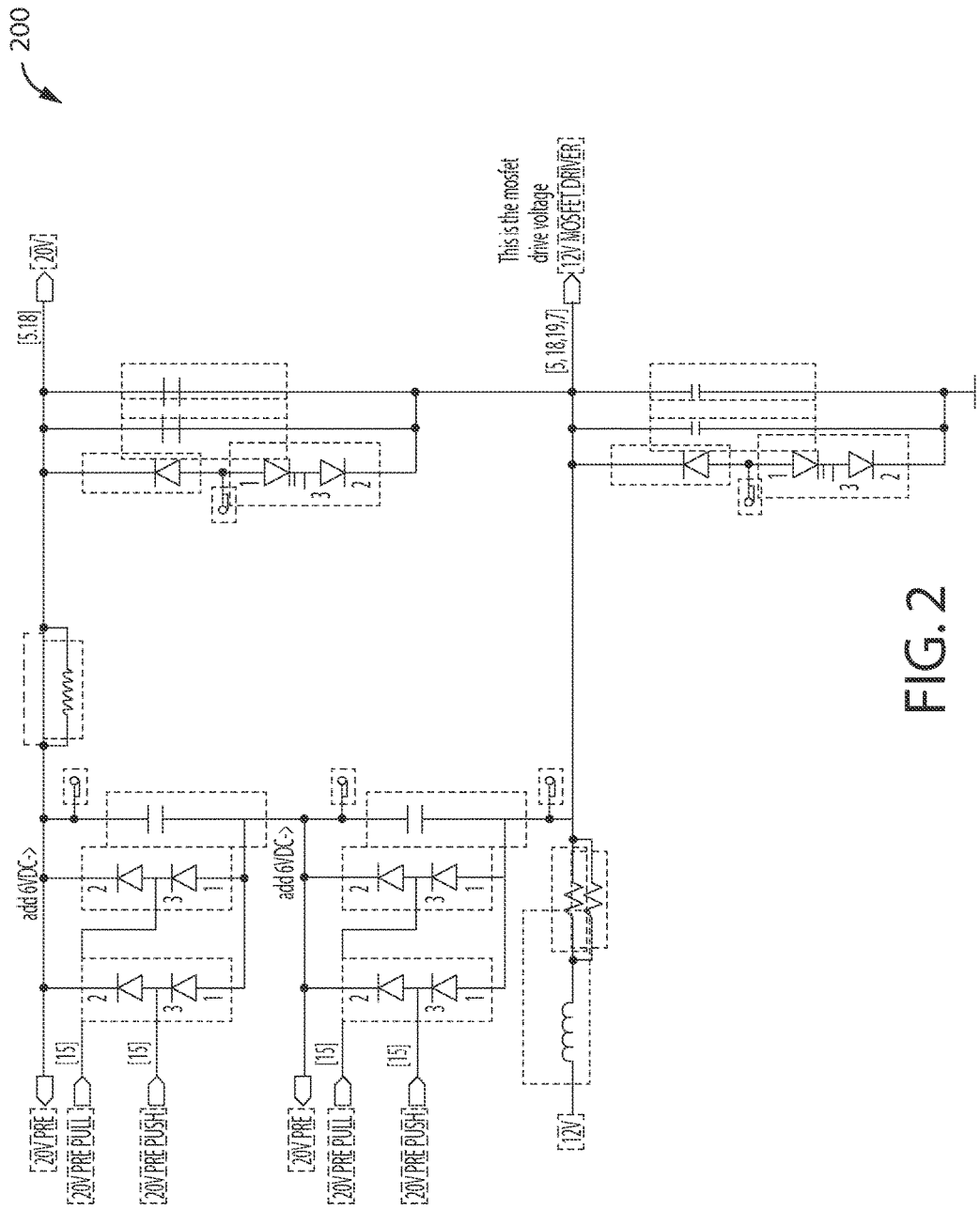
FIG. 2 is an illustration of an embodiment of a circuit for controlling a contactor or relay.
Figure 3:
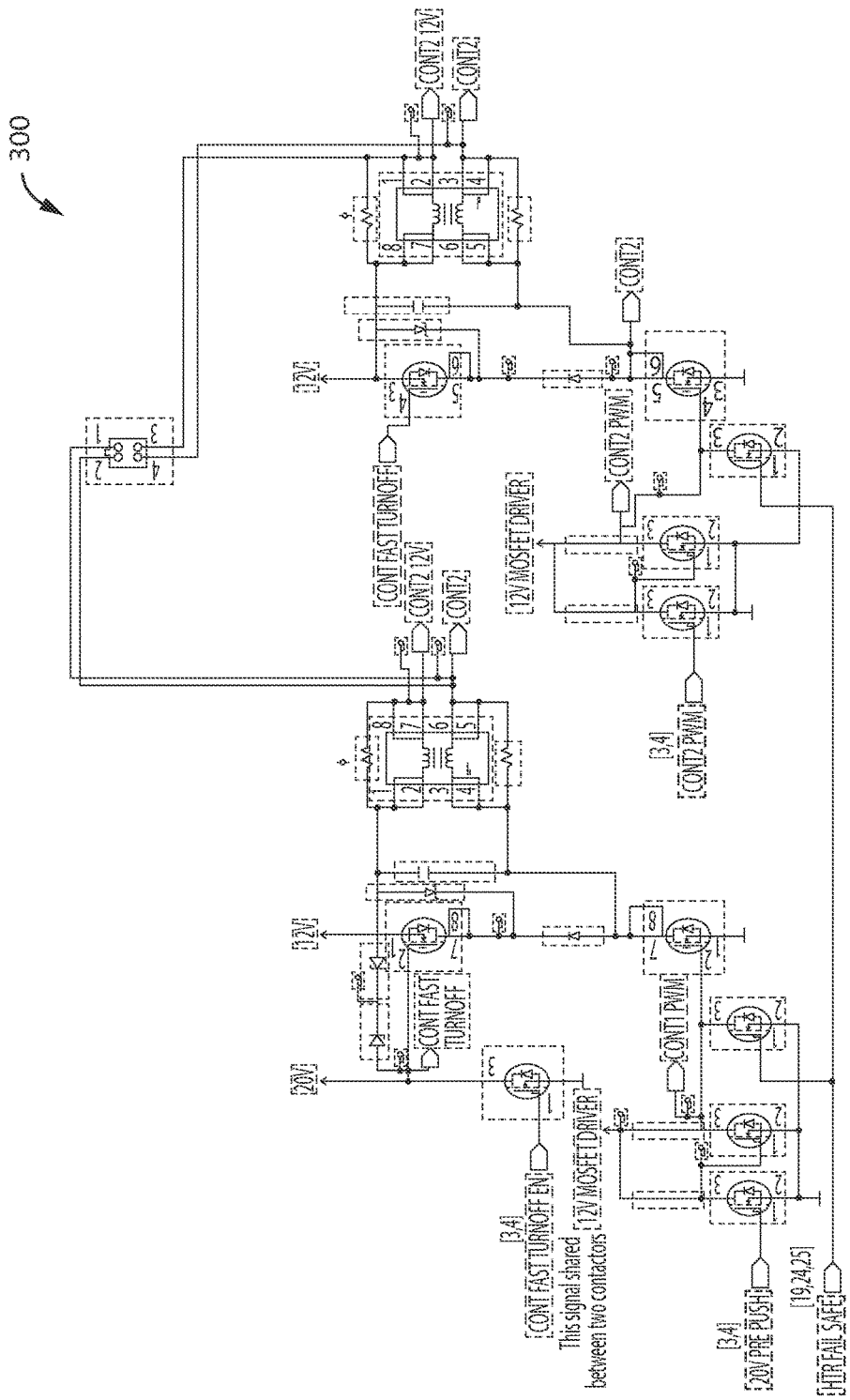
FIG. 3 is an illustration of an embodiment of a circuit for controlling a contactor or relay.
Figure 4:
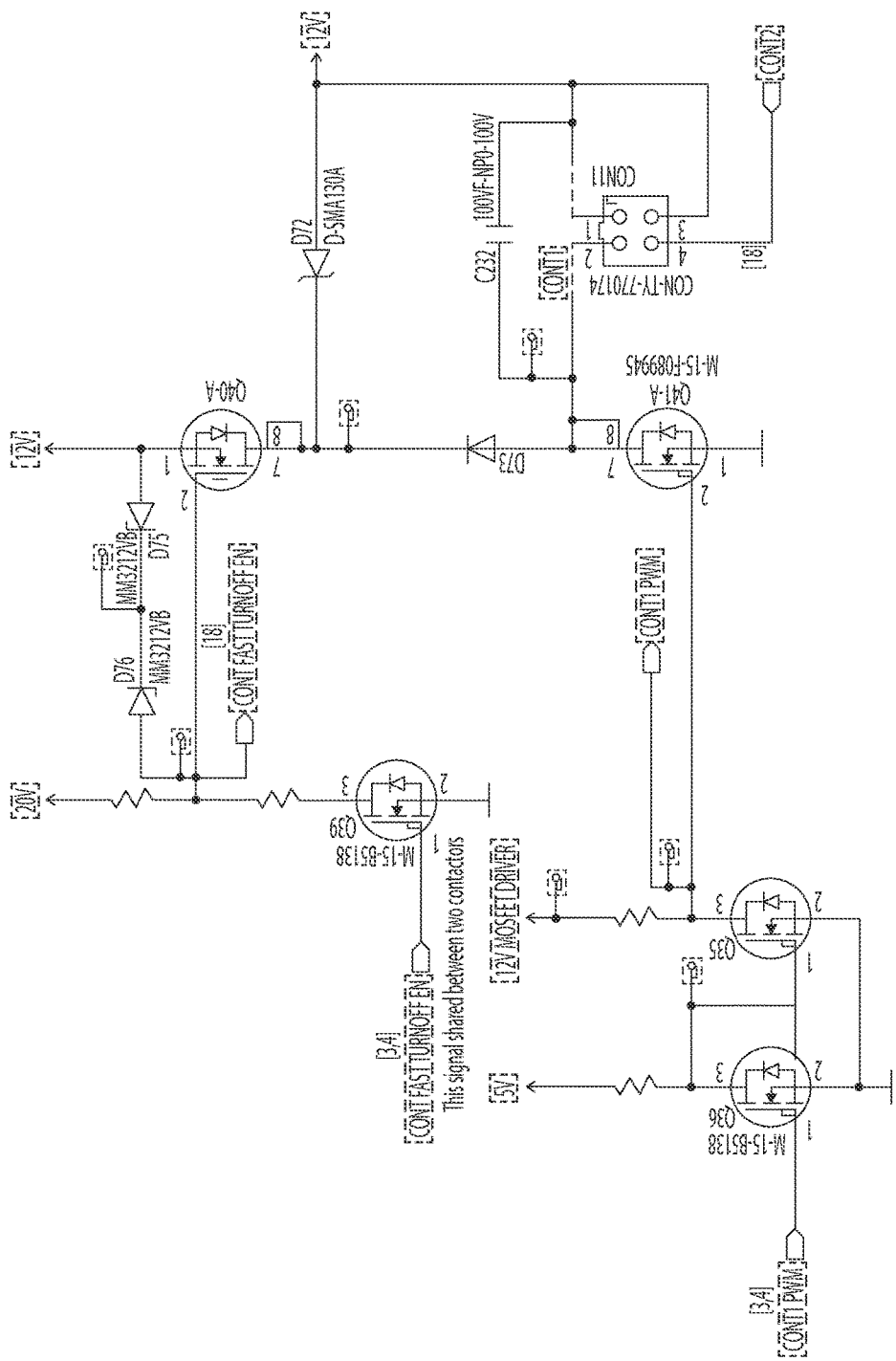
FIG. 4 is an illustration of an embodiment of a circuit for controlling a contactor or relay.

Embodiments of the subject matter disclosed herein relate to battery management circuitry designs. The term "component" as used herein refers to a portion of hardware, a portion of software, or a combination thereof. A portion of hardware can include at least a processor and a portion of memory, and the memory includes an instruction to execute. The term battery as used herein denotes energy storage devices generally and is inclusive of traditional batteries, as well as supercaps and ultracaps, fuel cells, and the like.

In one embodiment, a system includes a first circuit that receives a reference voltage; a second circuit that receives an resistance temperature detection (RTD) wire voltage; an amplification circuit configured to receive the reference voltage and the RTD wire voltage, and further configured to produce an analog output signal; an analog-to-digital converter (ADC) device that converts the analog output signal to a digital signal output; and software programmable processing device (SPPD), for example a processor, configured to process the digital signal, and further configured to control a thermal component of a battery.

To further alternative embodiments of the invention, FIGS. 1-4 illustrate circuits (e.g., 100, 200, 300, and 400) are provided to illustrate circuits for use with a battery. This contactor economizer circuit includes conditioning circuitry 101, clamping circuitry 102, and power driving circuitry 103 to operate an electro-mechanical contactor or relay device. The contactor device 104 may be used to connect and disconnect a battery of an energy storage system to an electrical bus of the energy storage system (e.g., to drive a load connected to the electrical bus). The contactor economizer circuit may exist in a battery management system (BMS) associated with the battery.

In accordance with an embodiment, the conditioning circuitry accepts two signals (CONT1_PWM and CONT_FAST_TURNOFF_EN) from a controller (e.g., a controller of a battery management system). The state of the two signals determines the operation of the contactor device (e.g., fast close, fast open, low power normal closed mode). For example, during a start phase, the controller drives the CONT_FAST_TURNOFF_EN signal low or inactive and the CONT1_PWM signal high or active. (More generally, each of the two signals is one of a first condition or a second condition, e.g., the first condition comprising a low or inactive signal level, and the second condition comprising a high or active signal level.) This causes a relatively high voltage level (e.g., 12 VDC) to be applied to the contactor device via the power driving circuitry, causing the contactor device to close quickly and connect a battery to an electrical bus to drive a load, for example. The relatively high voltage level may be applied for 0.5 second or 1.0 second, for example, to ensure that the contactor device closes. The relatively high voltage level may be applied for a longer time than the contactor is required to close to allow any momentarily high contact currents to dissipate.

After the contactor device closes, the CONT1_PWM signal may be changed by the controller to a pulse width modulated signal (e.g., having a 50% duty cycle) to enter a normal or economizer modulation phase which causes the power driving circuitry to provide a pulse width modulated signal having a lower voltage level (e.g., 6 VDC) to the contactor device. The lower voltage pulse width modulated signal keeps the contactor device in a closed state but uses less electrical energy to do so, compared to the relatively high energy used to initially close the contactor device. In accordance with an embodiment, the pulse width modulated signal is a square wave operating at a frequency of one kilohertz. The PWM frequency could be more or less one kilohertz.

When the controller selects to open the contactor device (e.g., to disconnect the associated battery from the electrical bus), the controller drives the CONT_FAST_TURNOFF_EN signal high or active and drives the CONT1_PWM signal low or inactive during a stop phase. This energizes the clamping circuitry to apply a relatively large clamped reverse voltage (e.g., −30 VDC) to the contactor device, causing the contactor device to open quickly. In this manner, the contactor device may be closed or opened quickly, and kept closed (e.g., most of the time during normal economizer operation) without consuming excessive amounts of electrical energy.

This economizer circuit may allow a contactor or relay to be driven at low-power. Without this economizer circuit, the drive may have to be driven at a relatively higher power level. The circuit may further allow for fast turn-on and fast turn-off of a contactor device. With respect to a battery system, the contactors are placed between the battery and an electrical bus. The system may have either one contactor or two contactors, for example, and when the contactors are closed the battery is coupled to the electrical bus. This allows a charge, a discharge, or a normal condition with power efficiency characteristics based on pulse width modulation (PWM).

Embodiments can be used with a sodium battery, among other types of batteries and energy storage devices. The economizer circuitry may be used in a battery management system and in any circuit requiring an electromechanical contactor or relay. The circuitry can be installed on a board forming a Printed Circuit Board Assembly (PCBA). The economizer circuit can close the contactor under full voltage which ensures a fast closing rate. Then after some defined programmable time, the circuit switches to an economizer mode (normal mode) where PWM is used to allow the contactor to remain closed but run at a reduced power level. The power level reduction can be substantial. For instance, the reduction of power using PWM can provide a 50% reduction in power consumption while in an economizer mode. Normal operation may be for the contactor to be closed with the economizer circuit operating in low-power mode.

The economizer circuit can energize the contactor to open it, close it, or keep it in a closed state. The circuit closes under full voltage, so it closes quickly in time. When the circuit runs in the economizer mode, the circuit runs efficiently with low power. A third function allows the contactor to open quickly by opening into a high reverse voltage. This is an electro-mechanical relay or contactor where current flows through a coil. To bleed that current off quickly, a high voltage or reverse potential can be forced across the coil. For instance, during a start mode, the circuit can begin by applying a steady 12-volt signal to the contactor, which can mean the contactor is going to close fairly quickly. The circuit can then run at about 6 volts average which is efficient in regards to power in the economizer mode. When the circuit is to be opened, the switches (e.g., transistors) can be set to apply a higher voltage across the contactor, which can be in the range of 30 volts (e.g., having a reverse polarity of the original voltage of 12 volts).

For instance, the 12 volts initially applied may be a steady voltage. For example, if the circuit is to be closed faster, a higher voltage may be used. Once the contactor is closed, then switching to pulse width modulating the 12 volts (or some set voltage for the contactor) may be performed, and the circuit is created in such a way that PWM may be efficiently used. The open phase voltage that would command the opening can be created by a surge control device, a component, that basically clamps the fly-back voltage at about 30 volts or a voltage used to open the contactor quickly. That device may be a transorb, a transient-voltage suppression (TVS) diode, a surge control device, among others.

Embodiments provide a three-phase circuit that allows a normal operation mode that is low cost in terms of the power consumption as well as component costs (e.g., circuitry, hardware, etc.). The three phases or modes are closed, normal (economizer), and open. Based on the normal mode operation, the circuit can run at a low state of power using PWM, and when going from the closed condition to the normal condition and the normal condition to open condition, there is a fast pulse capability based on the voltage levels implemented.

For instance, examples of applied voltages can be a steady 12 volts to get to a closed condition (which can be dropped to a lower voltage with PWM), and a surge control device can provide a greater voltage of an opposite polarity from that of the voltage for the closed position to switch the contractor back into an open position.

A voltage level or voltage used in embodiments includes a range of buffer or error and such range is within the scope of the subject disclosure. For instance, a 12 volt level can be a 13.5 volt level. Thus, a range of 1.5 volts for each voltage can be included within the scope of the subject disclosure. The circuit can include a 12 volt power signal. The circuit can include more auxiliary supplies, providing a 20 volt signal which is used for low-level signaling, for example.

In embodiments, the contactor may begin in an open condition. A signal called "Contactor_Fast_Turnoff_Enable" may be included with the circuit. This signal may be low or inactive (e.g., not trying to turn off the contactor). The signal "CONT1_PWM" may be low or inactive with the relay open. For the circuit to close the contactor or the relay, the CONT1_PWM signal is driven higher. For instance, the signal can be controlled with software disposed in a controller in which CONT1_PWM is driven higher. If that first full-power step is for one second, then that signal is driven high for one second. This would be a start mode.

The power signal ("CONT1_PWM") is a software-driven signal that can be defined at startup. A software algorithm can define a time and a voltage which can be used to start based on the defined criteria. The circuit can drive that full-power start-up period (e.g., one second, half a second, among others). Then there is a transition to the low-power economizer operation. Pulse width modulating is used with "CONT1_PWM." For example, at 60% duty, the signal is high for 60% of the time and low for 40% of the time.

The circuit can output a PWM square wave having a percent duty cycle. This square wave signal is indirectly fed to the contactor. To initially condition or buffer the CONT1_PWM square wave signal, the CONT1_PWM signal goes into a first transistor which inverts the signal. Then it goes to a second transistor where the voltage may be scaled. The first transistor may be run on roughly three volts or five volts, and the second transistor may be run on 12 volts, in accordance with an embodiment.

CONT1_PWM_(which is different from but derived from CONT1_PWM) may be a buffered signal which drives the power transistor (Q41-A), wherein the power transistor has power-handling capability for the contactor. CONT1_PWM may be driven high to drive the contactor at full power to close the contactor quickly. When economizing, that signal can be pulse-width modulated and may still be conditioned or buffered by the two transistors discussed above.

During the start phase, when closing the contactor (no PWM), current flows from the power supply, through the coil of the contactor and moves through the power transistor Q41-A. When in the economizing mode and power transistor Q41-A if off, the current is clamped by D73 and transistor Q40-A. In the economization mode, the diode D72 is not allowed to see the current. So the circuit is not dissipating power in that clamping diode D72 during the economization mode.

When the contactor is to be turned off (opened) from the economizer condition, two things may occur: pulse-width modulation stops (CONT1_PWM goes inactive), and the Contactor_Fast_Turnoff_Enable signal turns on. When the Contactor_Fast_Turnoff_Enable signal turns on, current flowing through the contactor is allowed to go through the clamping diode D72 which acts as a 30-volt clamp. The current circulates through that clamp which will place 30 volts (reverse polarity) on the relay and cause the rapid decay of current allowing the contactor to open.

The 30 volts may be provided by and created by a clamping device. This can be a dissipating clamping device called a transorb or a TVS, for example. The pulse width modulation signal and the enable signal come from the controller of the software-controlled controller of a Battery Management System (BMS).

In summary, the low cost circuit allows a contactor to start with high voltage, run at a low power "economized" voltage and turn off with high voltage. The low cost circuit allows the following: low cost; high voltage turn on for fast contactor closing; low power run mode; and/or high voltage turn off for fast contactor opening. During operation, the following may be provided: during start, the microprocessor holds the PWM rate at 100% which generates a fast close time; during runtime, the microprocessor sets the PWM rate to a programmable level, wherein the contactor power roughly tracks the PWM %; during turn off, the drive circuit allows a large reverse voltage to be generated across the contactor which forces a fast turnoff.

Figure 5:
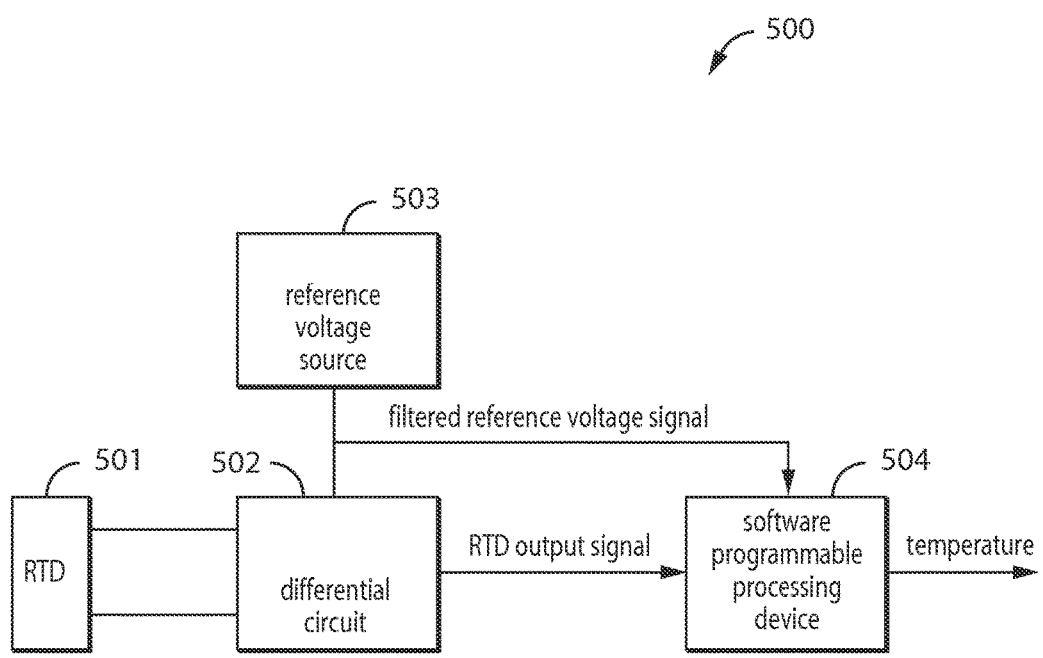
FIG. 5 is an illustration of a block diagram of an embodiment of a system for detecting temperature.
Figure 6:
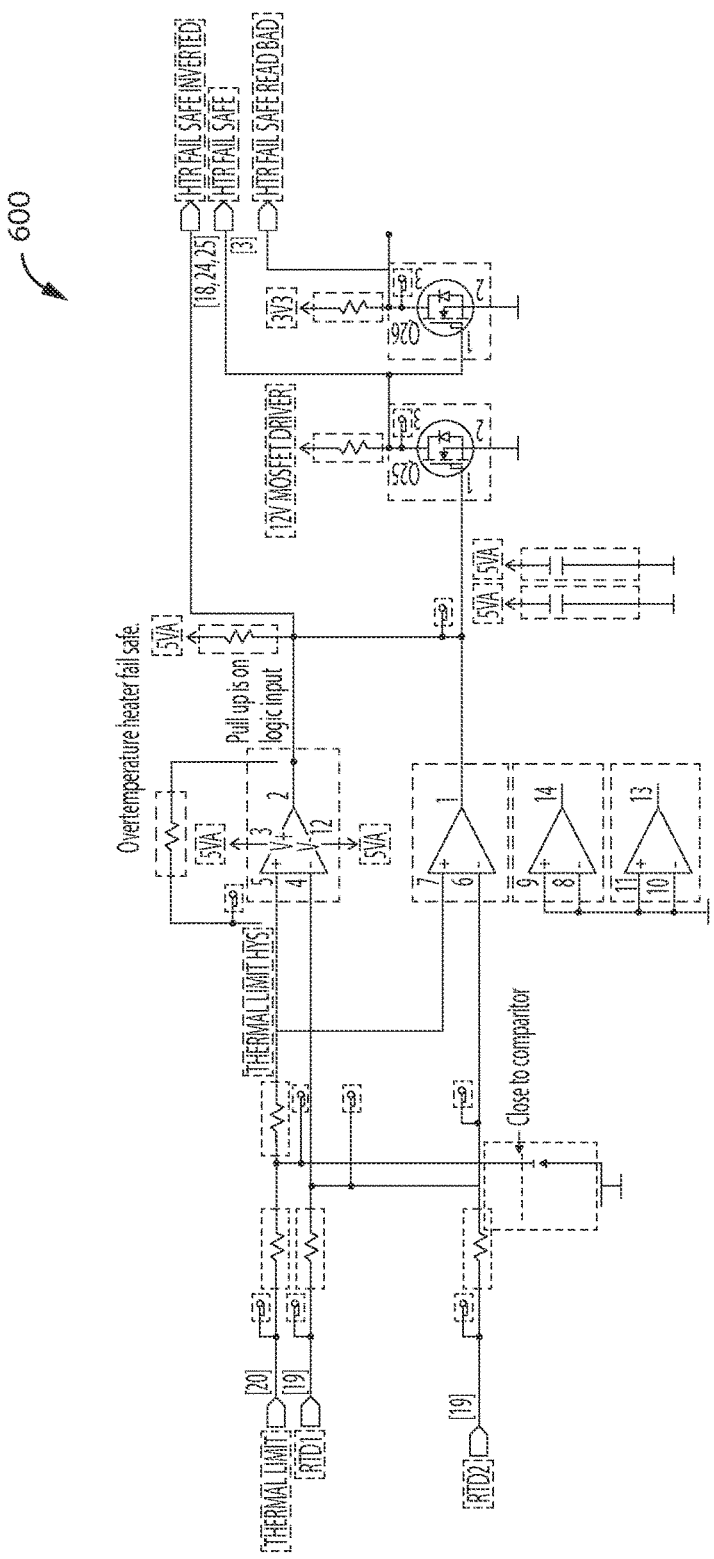
FIG. 6 is an illustration of an embodiment of a circuit for hardware comparison of multiple temperature signals to a common setpoint.

FIG. 5 is an illustration of a system 500 for detecting a temperature in an environment of which electrical circuitry and/or configuration is illustrated in FIGS. 7A, 7B, 7C, and 7D. In general, FIGS. 6-7 illustrate circuits (e.g., 500, 600, and 700) that illustrate an RTD circuit.

Referring to the block diagram of the RTD sense system 500 as depicted in FIG. 5, the system includes a resistance temperature detection (RTD) unit 501, a reference voltage source 503, a differential circuit (DC) 502, and a software programmable processing device (SPPD) 504. In one embodiment, the SPPD may be a processor. The circuit is rendered nonlinear due to the RTD's changing resistance affecting the circuit gain. The RTD may exist inside a battery of an energy storage system and the reference voltage source, the DC, and the SPPD may exist in a battery management system (BMS) associated with the battery, in accordance with an embodiment. In an embodiment, the RTD may be a platinum wire filament (or other types), in accordance with an embodiment, and the electrical resistance of the RTD changes linearly with temperature over a particular temperature range. By sensing the resistance of the RTD (e.g., by introducing an electrical current to flow through the RTD), the temperature of the environment (e.g., the battery) in which the RTD exists may be determined.

The two terminals of the RTD are respectively electrically connected to the two inputs of the DC 502. The reference voltage source provides a filtered reference voltage signal that is applied to the DC to force an electrical current through the RTD causing voltages to appear at the inputs of the DC. The voltages appearing at the inputs of the DC are correlated to the resistance of the RTD which is correlated to temperature. In accordance with an embodiment, the DC converts the voltages appearing at the inputs of the DC to a single RTD output signal that is also correlated to temperature.

The level of the resultant RTD output signal also depends on the level of the reference voltage source signal and the non-linearity introduced by the DC. Since the reference voltage source is low cost, the level of the reference voltage source signal may tend to be inaccurate and vary over time. This can introduce deviations in the relationship between RTD resistance and determined temperature. Furthermore, the non-linearity introduced by the low cost DC distorts the linear relationship between RTD resistance and temperature. Therefore, values of the reference voltage signal and the RTD output signal are input to a SPPD to compensate for the inaccuracies and distortions.

The SPPD implements an algorithm (e.g., as a set of executable software instructions) that compensates for the non-linearity introduced by the low cost DC and any variations in the reference voltage signal. In accordance with an embodiment, the algorithm of the SPPD includes a reverse modeling of the non-linearity of the DC and RTD. As a result, the SPPD outputs a determined temperature value that accurately represents the temperature of the environment in which the RTD exists. Therefore, even though the reference voltage source and the DC introduce distortions and inaccuracies as a result of being low cost devices, the SPPD, which may include a simple low cost microprocessor, may be able to compensate for the distortions and inaccuracies to provide an accurate measurement of the temperature of the environment of the RTD.

In embodiments, the RTD is a passive device. For example, the RTD device can be a thermal couple; in other embodiments, the RTD may comprise a simpler structure, such as a wire having an appropriate composition/characteristics for resistance change as a function of temperature. The RTD can be made from, for instance, platinum (e.g., a fine platinum filament). Depending on how it is formed, platinum may have a temperature characteristic which allows resistance to change with temperature. This resistance change is detected in accordance with embodiments. RTD circuits can be driven by a high cost reference current providing a tightly-controlled current reference. The circuit described herein, however, allows for a range of drift of voltage and the introduction of non-linearities, but still provides good accuracy of temperature determination.

Turning to FIGS. 6-7D and 10, the circuits illustrate a filtered voltage, formed by applying filtration (e.g., LC circuit, resonant circuit, inductor-capacitor circuit, among others), which is provided to act as a filtered reference signal, in accordance with an embodiment. Unless otherwise indicated, "circuit(s)" refers to one or more of the circuits illustrated in FIG. 6, 7A, 7B, 7C, or 7D. A 5 volt reference signal can be used, for example. The circuit(s) may be a non-linear circuit providing an output that is read by a SPPD or other processor (e.g., a processor illustrated and discussed with FIG. 7D), and an algorithm of the processor is used to linearize the circuit(s). Additionally, a low-accuracy, low-cost reference, in this case, the 5 volt filtered reference, can also be read by the SPPD or other processor. The SPPD or other processor can account for that 5 volt filtered reference and put that value into the calculation to obtain the temperature. The circuit(s) allows the 5 volt filtered reference to drift around in value and the algorithm and/or component can compensate for that drift. The circuit(s) also protects the device from external signals that are in the environment. In embodiments, the circuit(s) include clamps (or other voltage conditioners) to protect from external signals.

Signals RTD 1+ and RTD 1− are signals that feed into a wire to the RTD. The circuit(s) use a 1000 Ohm platinum RTD, but an RTD with a suitable range can be used. The circuit(s) can include a resistor and a bias resistor(s) the values and/or outputs of which can go into the calculations. The circuit(s) include a filter element to create low-pass filtration. The circuit(s) also include a difference amplifier. Due to those first two resistors and due to the RTD's changing resistance, that difference amplifier becomes part of the circuit(s) and is where the non-linear nature of the circuit(s) is introduced.

The non-linear nature of the circuit(s) is calibrated out in order to use the components and elements that minimize cost of the circuitry. The circuit(s) compensate for the 5-volt reference signal that is read separately along with the RTD output signal. So the circuit(s) read those two values, and then uses them in an equation to produce the linearized temperature without a high-accuracy reference.

The RTD, the resistors, amplifier and the outbound RTD signal form an electrical network. The equations for that network can be derived and inverted. The output RTD1 can be inverted based on the nonlinearity of the overall circuit operation. Therefore, by knowing the output RTD1 (the RTD output signal), it gives the voltages back on the inputs, i.e., the voltages from the RTD. The inverted equations input the 5-volt reference signal and it outputs the resistance of the external RTD. A second lookup table takes the resistance and indicates the temperature. Instead of using a lookup table, the 1000 ohm platinum RTD has a known temperature characteristic that may be represented by a polynomial, for example. Therefore, the RTD characteristic temperature versus resistance may be measured and a polynomial may be fit to it providing a second equation that gives the number corresponding to the temperature. Alternately, the nonlinearity of the circuit(s), the nonlinearity of the RTD and the value of the variable reference voltage can be combined in one equation that is inverted during the design stage. The resulting inverted equation is processed during device operation and gives one level of processing to determine the RTD temperature.

RTD1 is a value that will change in a pre-determined manner as the 5-volt reference signal changes and the 5-volt reference signal is going to change slowly. The 5-volt reference signal becomes an input to the algorithm.

The low cost circuit(s) use hardware and software to excite, read, and linearize standard RTD. The circuit(s) also have resistance to EMC waves. The circuit provides the following: low cost; high EMC immunity; and uses "no cost" software to linearize the circuit. Normally, RTD circuits use a high precision current source to excite the RTD, after which an amplifier reads the voltage which is linearly mapped to the sensed temperature. Due to the high precision excitation, EMC protection is often difficult. In accordance with an embodiment, the circuit(s) provide the following: excitation; uses a low cost, low accuracy voltage to excite a circuit network that includes the RTD; and the low accuracy nature of the excitation allows diode protection of the circuit from external EMC In addition, the circuit(s): apply the excitation to a combined circuit including the RTD and input amplifier; the integral amplifier circuit reads the voltage across the RTD, wherein the output voltage read is not linear with respect to temperature; and/or a SPPD or processor that reads the amplifier output, reads the value of the excitation applied to the network, and/or uses an algorithm to linearize the RTD reading and correct for excitation inaccuracy.

Figure 7A:
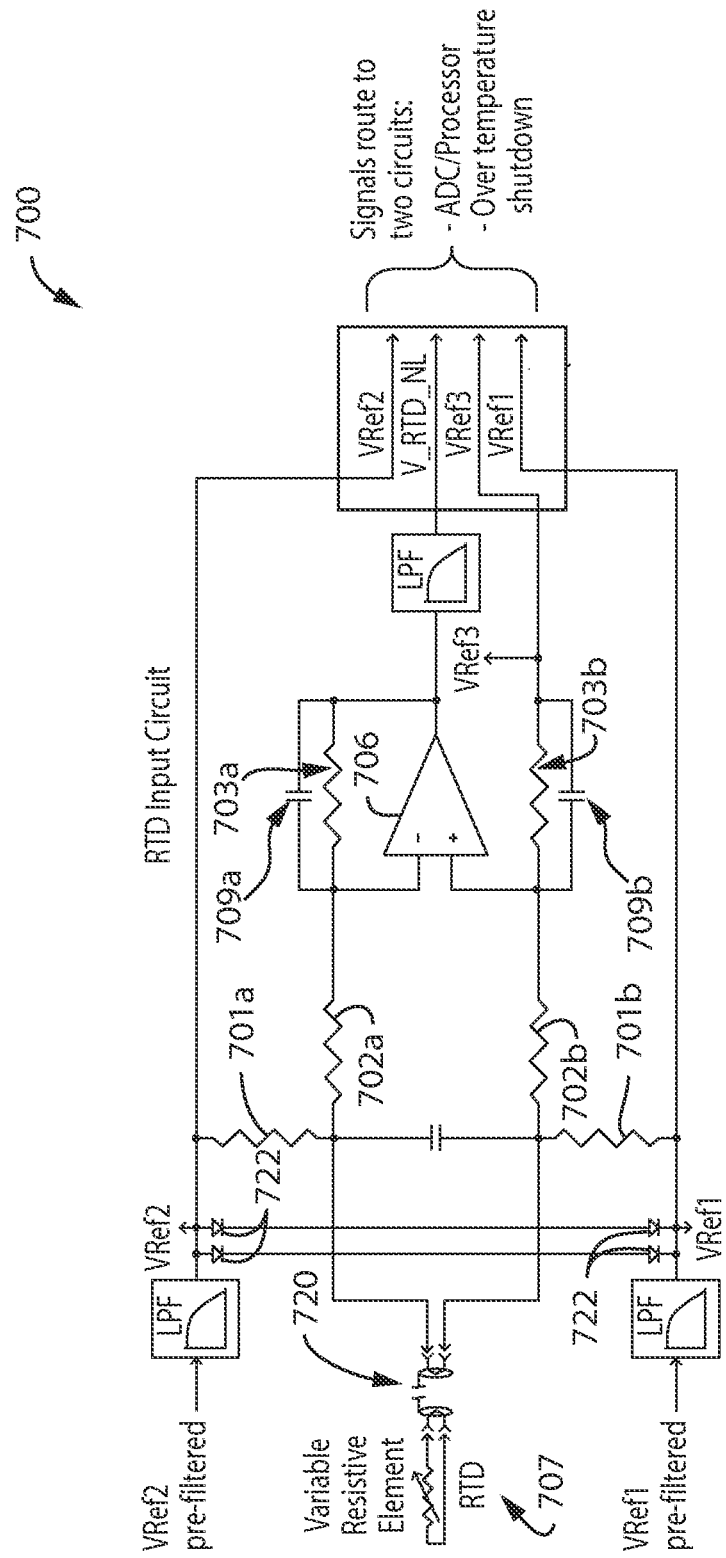
FIG. 7A is an illustration of an embodiment of a circuit for detecting temperature.
Figure 7B:
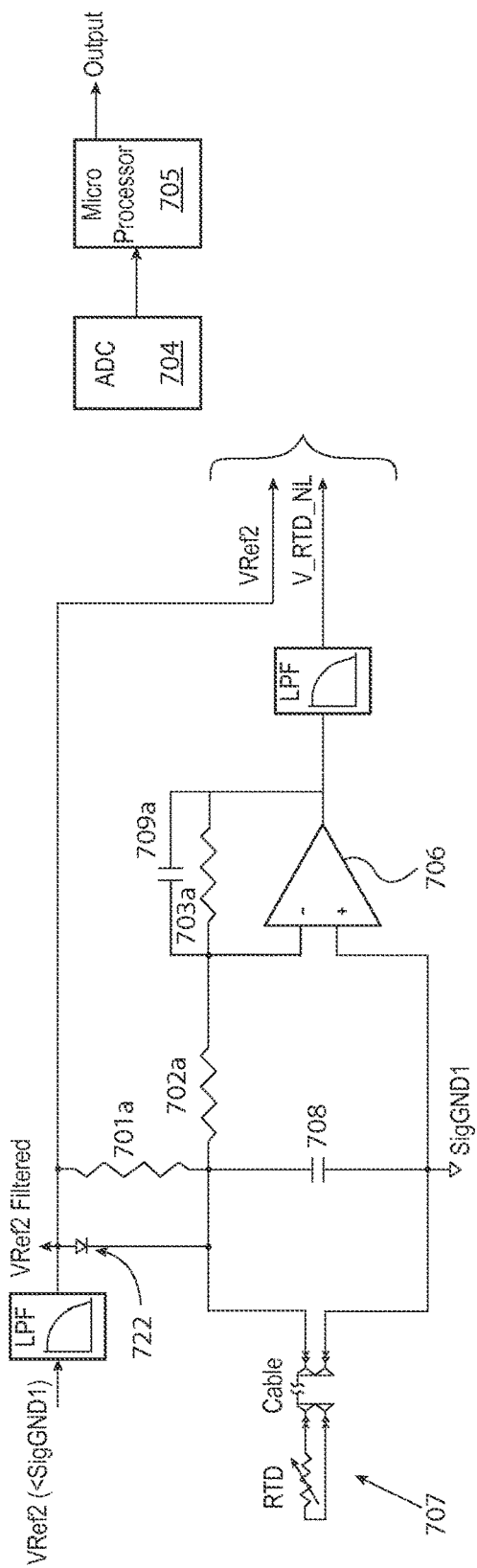
FIG. 7B is an illustration of an embodiment of a circuit for detecting temperature.
Figure 7C:
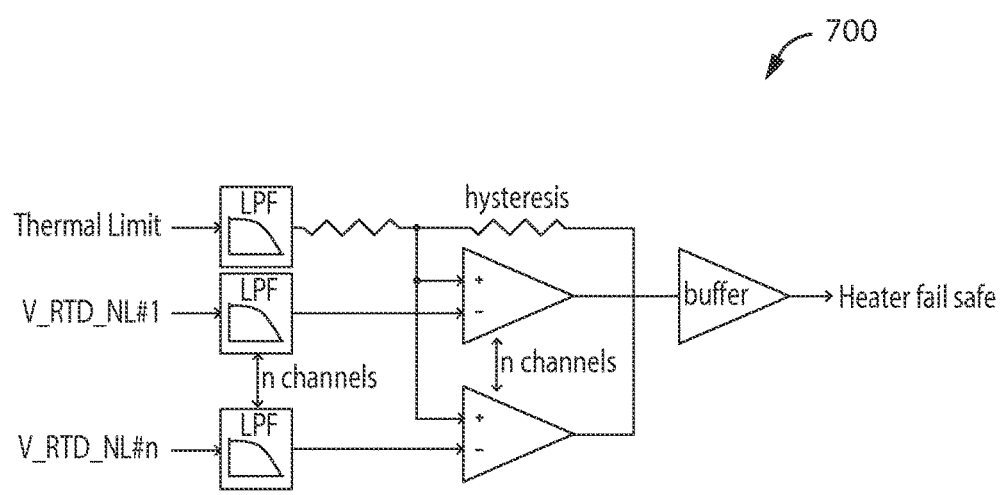
FIG. 7C is an illustration of an embodiment of a circuit for hardware comparison of multiple temperature signals to a common setpoint.
Figure 7D:
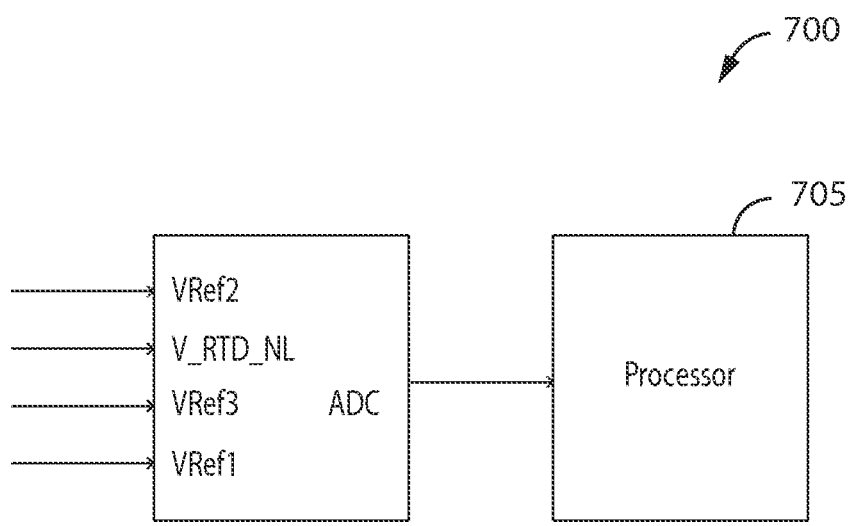
FIG. 7D is an illustration of an embodiment of a circuit for detecting temperature.

FIGS. 6 and 7C provide show a temperature comparison circuit that allows a hardware-only, multiple channel comparison of the nonlinear representation of temperature to be compared to a set point. The circuit as shown compares the nonlinear temperature representations to a Thermal Limit set point that could be statically generated or dynamically generated by hardware circuits and software algorithms. Once one of the RTD channels exceeds the Thermal Limit set point an output logic signal is set. In this case the output logic signal is a heater fail safe circuit that will automatically and without software intervention disable a heater. In many critical systems some actions cannot be trusted to low reliability microprocessor circuitry and software algorithms.

Turning to FIGS. 7A, 7B, 7C, and 7D, an RTD sense system 700 is illustrated. Electrical components and elements used with circuit(s) discussed in at least FIGS. 2-4, 6, 7A, 7B, 7C, 7D, and 10 are shown below in Table A.

TABLE A

| | |
|---|---|
|  | Diode |
|  | Capacitor |
|  | Inductor |
|  | Resistor |

Thus, one of ordinary skill in the art can select and chose electrical components based on the depicted components in Table A and/or select electrical components not shown to provide the functionality described herein. The RTD sense system comprises one or more RTD units 707 connected to a battery or other energy storage system. The RTD output is connected to a differential circuit (DC), which comprises an analog to digital converter (ADC) device 704. The differential circuit (DC) is in turn is connected to a SPPD or other processor 705 via the ADC device 704. The RTD uses a change in resistance to capture the change in temperature. In a traditional RTD system, a high precision current is received from an independent precision circuit. The measured difference in voltage is then used in a linear relationship to compute the $R_{RTD}$. The resistance value is, in turn, used to compute the temperature. The subject RTD SENSE CIRCUIT illustrated and discussed herein replaces the high precision circuit (which is separate and independent of the RTD), thus lowering the cost.

In an embodiment illustrated in FIG. 7A, the RTD SENSE CIRCUIT comprises a primary voltage resistor 701 and a secondary voltage resistor 702. The effective primary reference voltage $V_{ref}$ is applied across the primary and secondary resistor, thus inducing a primary current $I_{ref}$ across the RTD wire represented by 720. In a particular embodiment the RTD comprises two wires twisted together to form either end of the RTD lead.

In another embodiment, a differential amplifier configuration is used to reject electrical noise, reject spurious high energy events, and improve performance while maintaining low cost circuitry and low cost, low accuracy references used to excite the RTD. The additional cost for the differential amplifier is small and is implemented through the additional resistance pairs provided, represented by numerals 701a and 701b, 702a and 702b, and 703a and 703b. The resistance pairs are referred to as resistance pair 701, 702, and 703. Each resistance pair is duplicated and is populated with identical values, within standard tolerance. The resistance pair 701a/b form the connection to the low precision reference voltage. The resultant effective reference voltage is Vref is equal to Vref1–Vref2. The reference voltage is low pass filtered by low cost resistance/capacitor (RC) or inductor/resistive/capacitor (LRC) techniques. The resultant Vref is applied to the network of resistors (701a/b, 702a/b), the RTD and the amplifier's action to create a virtual short at respective +/− nodes. Due to the RTD's changing resistance with temperature, the resultant voltage and currents in the network will be a nonlinear function of the network components and temperature as well as the low accuracy reference voltage. Resistors 703a/b (each referred to herein as a gain resistor) set the gain of the differential amplifier. The relative output reference voltage for the differential amplifier is set by Vref3. This reference voltage (Vref3) is set to establish compatibility with following processing stages. In addition to the network provided by the resistors there is protection from spurious high energy events typical in harsh industrial environments. This protection may be provided by a network of low leakage diodes. Under normal conditions, these diodes are not effectively part of the circuit and do not change the effective voltages and currents.

Amplifier output voltage=non-linear function of:
$R_{RTD}$,component values,Reference voltages, and Calibration data.

The output of the amplifier is routed to two follow on circuit blocks: 1) an ADC and processor circuit that through software linearizes the amplifier output voltage and obtains the RTD temperature, and 2) a hardware only circuit that functions as an over-temperature fail safe circuit. Controllers may include software that can invert data and can used to capture data. For instance, software can be used to compute resistance or temperature.

The Amplifier output voltage is a non-linear function of the RTD temperature, circuit component values and reference voltages. The ADC and SPPD or other processor circuit reads the amplifier and reference voltages. A calibration process gives values for the circuit component values. An algorithm inverts the network equations, inputs the values read from the ADC and the calibration information and solves for the RTD temperature. The output of the algorithm is the RTDs temperature.

$T_{RTD} = f^{-1}(R_{RTD},$Component values,Reference voltages,calibration data).

The controller can include software that can compute resistance or temperature. The over-temperature fail safe circuit may use the output of an RTD conditioning circuit to provide a hardware only over-temperature shutdown function. A hardware-only solution to the over-temperature shutdown may be useful alternative, or additional robustness, for a software and/or microprocessor circuitry solution. The over-temperature shutdown circuit may automatically compensate for low accuracy references and voltage offsets (Vref3) required by other circuitry by generating a trip point from the references and offsets their selves. The circuit works with any number of RTDs. The circuit compares the trip point through standard low cost comparators. There is hysteresis added to the comparator function to reduce the influence of electrical noise.

$$V_{RTD} = f(R_{RTD}, \text{Component values}, V_{ref}).$$

The component values can be the output of the operational amplifier 706. The controller includes software that can be used to invert the data and to capture such data. In the above relationship the resistance value is unknown. The RTD resistance is computed using the inverse of this relationship. This computed value is then used to determine temperature, using known values in the curve of the temperature and resistance. The circuit further comprises an ADC convertor and a SPPD or other processor. The ADC converts the analog values of voltage to digital value for the processor to process. The processor then used the values in an inverse relationship as given below to compute the resistance value.

$$R_{RTD} = f^{-1}(\text{Temp}_{RTD}, V_{RTD}, \text{Component values}, V_{ref}).$$

Software can compute resistance or temperature. The above circuit as described may be subject to noise, EMI and EMC interference. To overcome this interference a diode clamp 722, for example, may be provided. The diode clamp may provide noise cancellation as illustrated in FIG. 7A. In one embodiment, an RC low pass filter is used to condition a signal (e.g., voltage of RTD, thermal limit, etc.) as illustrated in 7C.

The circuit as described has two legs represented by a suffix of "a" and "b" for the electrical components. A suitable alternative circuit may have only a single leg. By way of example and not limitation, FIG. 7B illustrates a single leg circuit (e.g., one leg circuit) that includes diode 722, RTD 707, resistors 701a, 702a, 703a, capacitors 708, 709a, operational amplifier 706, ADC 704, and SPPD or other processor 705. The two leg difference circuit (e.g., illustrated in FIG. 7A) allows the voltage across RTD to be read in harsh industrial environments.

An effective reference voltage applied to the RTD is Vref1−Vref2. In one example, Vref1 can be approximately 5 Volts and Vref2 can be approximately 0 Volts. Also, Vref3 may be zero or any other value. However, one of ordinary skill in the art can adjust the circuit so that Vref1, Vref2, and Vref3 can be a suitable voltage. By way of example, the Vref1 can be approximately 10 Volts, and Vref2 and Vref3 can be approximately −5 volts.

Figure 10:
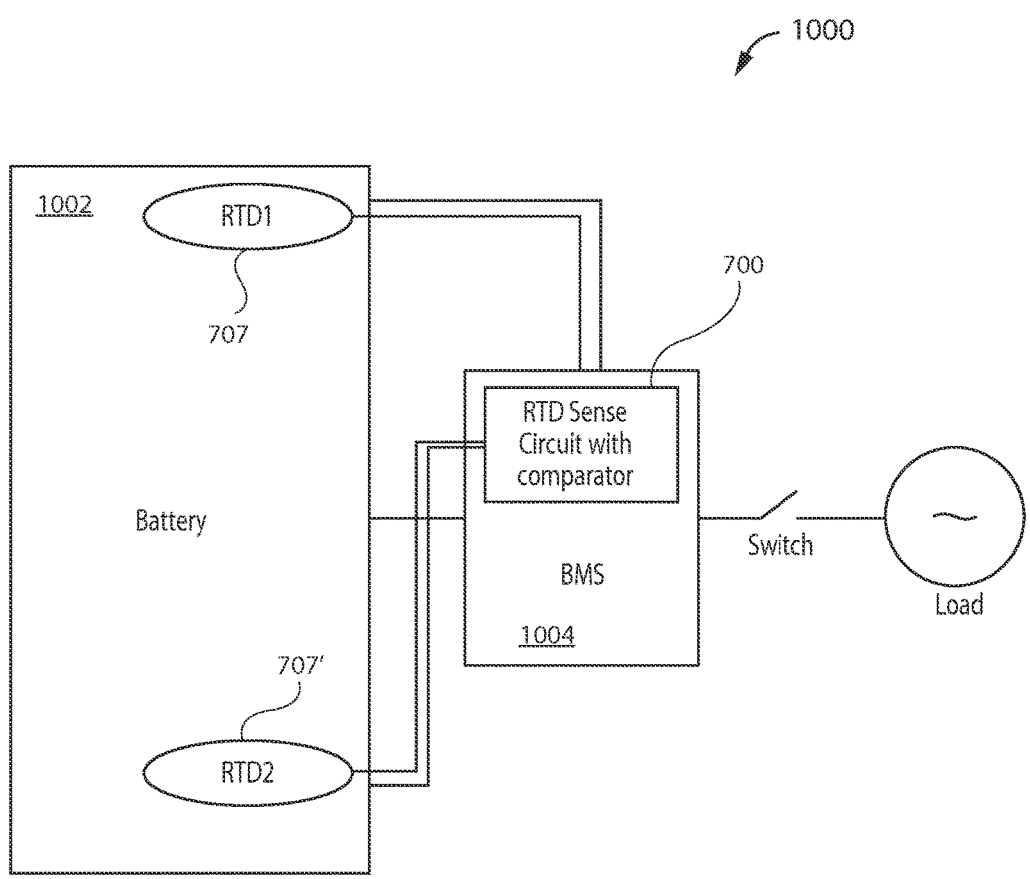
FIG. 10 illustrates a battery that utilizes an RTD sense system to detect temperature in accordance with the subject innovation.

In an embodiment, such a circuit could be used for measuring temperature across a battery. The battery may be connected to one or more RTDs. For instance, if the battery is connected to two RTDs, the two RTD's can measure temperature at two points associated with the battery device. For instance, FIG. 10 illustrates a battery system 1002. System 1000 includes a BMS 1004 that includes circuit 700 that controls a switch for a load, wherein the circuit 700 includes input from RTD1 707 and RTD2 707' from battery 1102. The system 1000 can include a thermal control unit, such as a heater component (not shown), heater circuit, or thermal controller that manages the heating and/or cooling of battery 1002.

The system circuit as described above functions to measure the temperature of the battery and that in turn allows the control of the heater circuit. In an additional embodiment, the RTD sense system additionally comprises a comparison circuit. The circuit as shown in FIG. 7C compares the nonlinear temperature representations to a Thermal Limit set point that could be statically generated or dynamically generated by hardware circuits and software algorithms. Once one of the RTD channels exceeds the Thermal Limit set point an output logic signal is set. In this case the output logic signal is a heater fail safe circuit that will automatically and without software intervention disable a heater. In many critical systems some actions cannot be trusted to low reliability microprocessor circuitry and software algorithms.

The aforementioned systems, circuits, components, and the like have been described with respect to interaction between several components and/or elements. Suitable devices and elements can include those elements or sub-elements specified therein, and some of the specified elements or sub-elements, and/or additional elements. One or more elements and/or sub-elements may be combined into a single component to provide aggregate functionality. The elements may interact with one or more other elements not specifically described herein.

Figure 8:
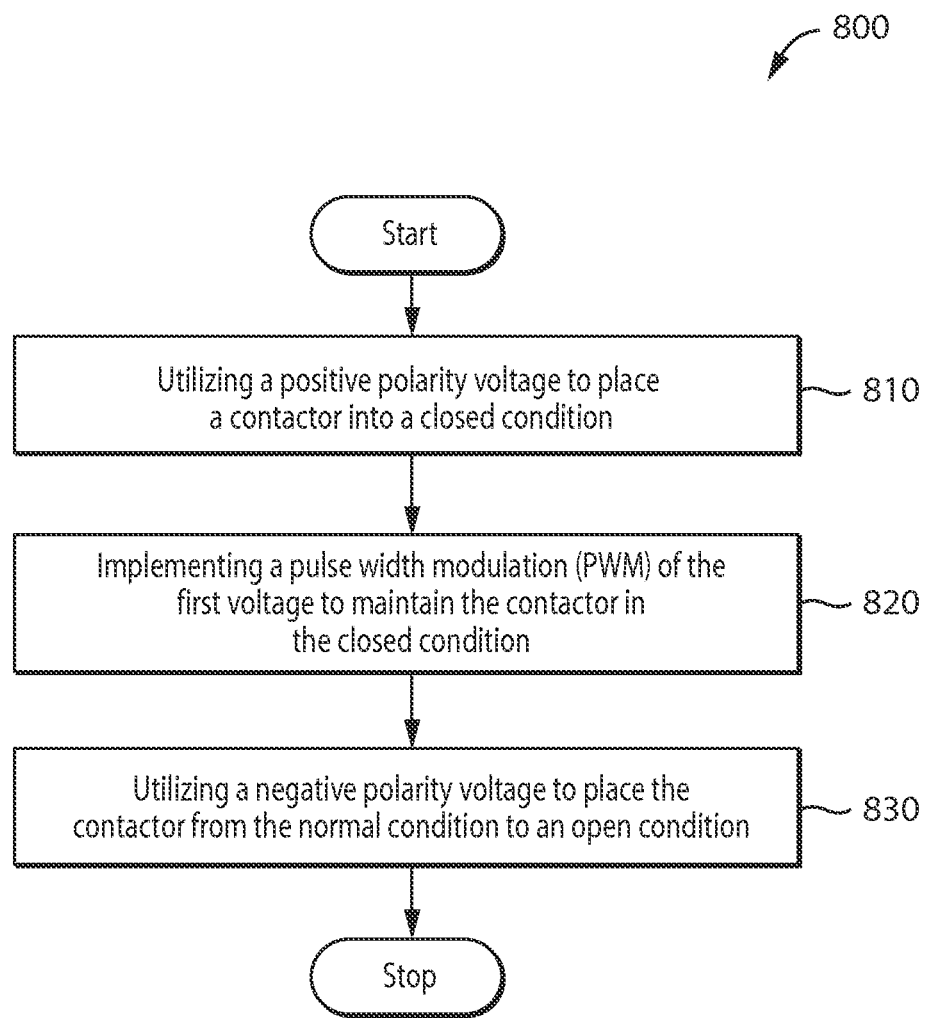
FIG. 8 illustrates a flow chart of an embodiment of a method for controlling a contactor or relay.
Figure 9:
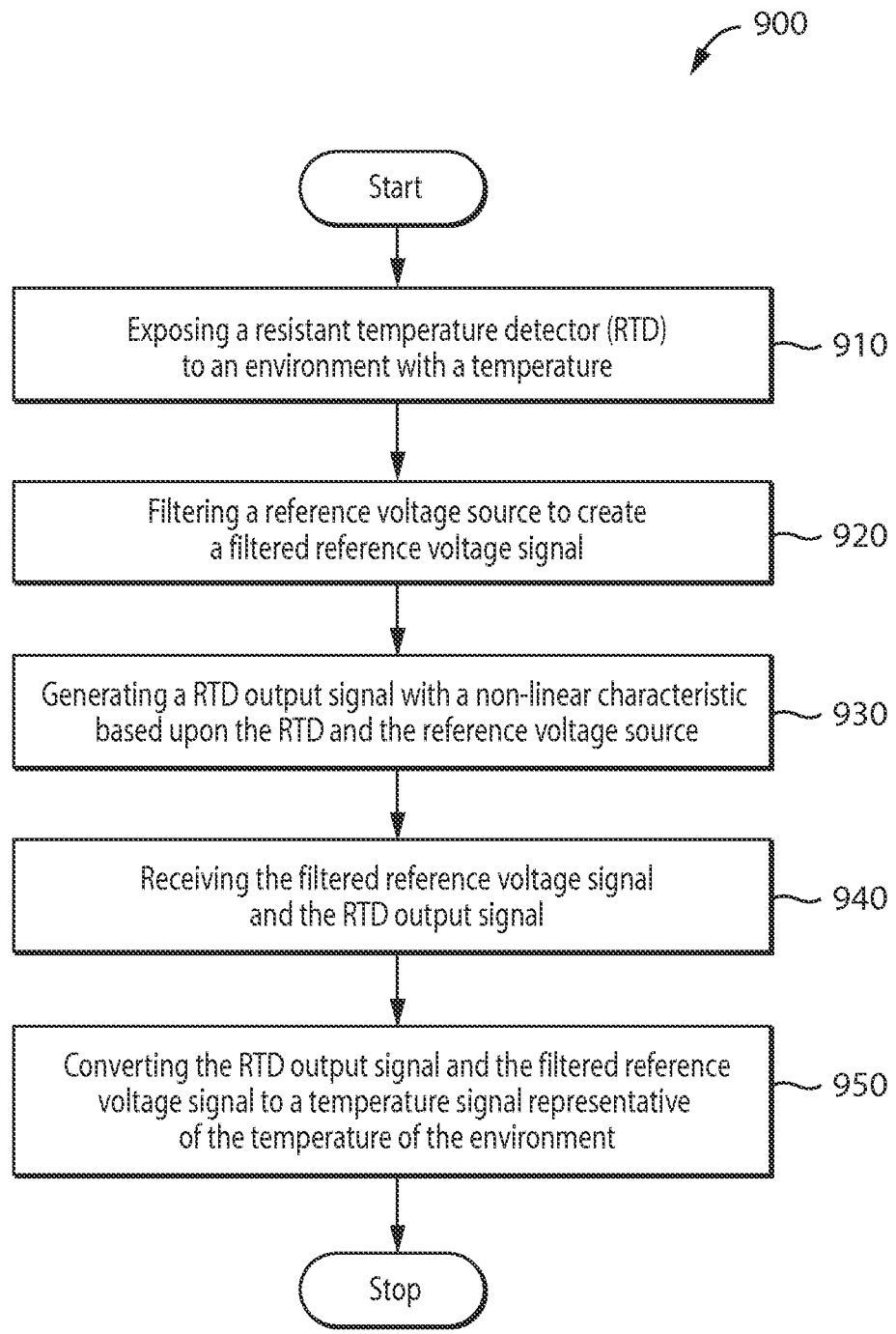
FIG. 9 illustrates a flow chart of an embodiment of a method for detecting temperature.

Methodologies may be implemented in accordance with the disclosed subject matter and with reference to the flow charts of FIGS. 8-9. Although the methodologies are shown and described as a series of blocks, the claimed subject matter is not limited by the order of the blocks, as some blocks may occur in different orders and/or concurrently with other blocks from what is depicted and described herein. Moreover, not all illustrated blocks may be required to implement the methods described hereinafter. The methodologies can be implemented by a component or a portion of a component that includes at least a processor, a memory, and an instruction stored on the memory for the processor to execute.

FIG. 8 illustrates a flow chart of a method 800 for controlling a contactor or a relay. At reference numeral 810, a positive polarity voltage is utilized to place a contactor into a closed condition. At reference numeral 820, a PWM of the first voltage is implemented to maintain the contactor in the closed condition. At reference numeral 830, a negative polarity voltage is utilized to place the contractor from the normal condition to an open condition.

FIG. 9 illustrates a flow chart of a method 900 for detecting a temperature. At reference numeral 910, a RTD is exposed to an environment with a temperature. At reference numeral 920, a reference voltage source is filtered to create a filtered reference voltage signal. At reference numeral 930, a RTD output signal is generated (VRTD) with a non-linear characteristic based upon the RTD and the reference voltage source. At reference numeral 940, the filtered reference voltage signal and the RTD output signal are received. At reference numeral 950, the RTD output signal and the filtered reference voltage signal are converted to a temperature signal representative of the temperature of the environment.

In an embodiment, a sensing circuit comprises a first circuit, a second circuit, and an amplification circuit. The first circuit is configured to receive a reference voltage. The second circuit is configured to receive a resistance temperature detection (RTD) wire voltage. The amplification circuit is configured to produce an analog output signal based at least in part on the reference voltage and the RTD wire voltage. The sensing circuit further comprises an analog-to-digital converter (ADC) device that is configured to convert the analog output signal to a digital signal output, and a processor configured to process the digital signal and control a thermal control unit of a battery (e.g., control may be based on the digital signal as processed).

In another embodiment of the sensing circuit, the processor is further configured to process the digital signal as a non-linear voltage representation of a temperature of the battery.

In another embodiment, the sensing circuit further comprises a voltage conditioner coupled to at least one of the first circuit, the second circuit, or the amplification circuit. The voltage conditioner is configured to reduce noise and comprises at least one of a diode or a low pass filter. For example, in FIG. 7A the diode clamp 722 is coupled to the first circuit and indirectly to the second circuit and amplification circuit. In other embodiments, the voltage conditioner may be coupled directly to the second circuit and/or the amplification circuit, depending on the particular circuit configuration of the voltage conditioner used.

In another embodiment, the sensing circuit further comprises a comparison circuit coupled to at least one of the amplification circuit or the ADC device and configured to generate a signal for controlling a heater associated with the battery based at least in part on at least one of the analog output signal or the digital signal output.

Another embodiment relates to a sensing circuit comprising a resistance temperature detection (RTD) unit, a primary voltage resistor coupled with the RTD unit and configured to receive a reference voltage, a secondary voltage resistor configured to receive an RTD wire voltage from an RTD wire and that is coupled with the resistance temperature detection (RTD) unit, and a gain resistor configured to receive a secondary voltage value from the secondary voltage resistor and coupled to the secondary voltage resistor and an operational amplifier.

In another embodiment, the sensing circuit further comprises a voltage conditioner coupled to at least one of the RTD unit, the primary voltage resistor, the second voltage resistor, or the gain resistor. The voltage conditioner is configured to reduce noise.

In another embodiment, the sensing circuit further comprises an analog digital converter (ADC). The ADC is configured to convert an analog signal comprising the reference voltage, the RTD wire voltage, and an output voltage from the operational amplifier, into a digital signal.

In another embodiment, the sensing circuit further comprises a processor configured to process the digital signal, received from the ADC, as a non-linear voltage representation of a temperature of an energy storage system (e.g., battery).

In another embodiment, the sensing circuit further comprises a comparison circuit coupled to the ADC device and configured to receive an output value from the ADC. The comparison circuit is further connected to a heater via a heater fail safe circuit, and is configured to output a signal to the heater fail safe circuit to disable the heater, if the output value from the ADC exceeds a set value.

In another embodiment of the sensing circuit, the voltage conditioner comprises a filter having a resistance/capacitor configuration (e.g., the circuitry of the filter includes a resistor connected to a capacitor).

In another embodiment of the sensing circuit, the primary voltage resistor and the secondary voltage resistor are connected to the operational amplifier via the gain resistor. The operational amplifier is configured to provide an output signal representative of the reference voltage and the RTD wire voltage.

In another embodiment, the sensing circuit further comprises a processor configured to compensate for non-linearity characteristics introduced by the sensing circuit. In another embodiment, alternatively or additionally, the processor is further configured to compare multiple non-linear RTD output signals to a static signal or to a variable set point signal, and thereby to obtain a logical output signal. In another embodiment, alternatively or additionally, the processor is further configured to convert the RTD output signal and the reference voltage to a temperature signal representative of a temperature of a battery. In another embodiment, alternatively or additionally, the processor is further configured to control a heating component for a battery based on the temperature signal.

Another embodiment relates to a system comprising a reference voltage source configured to provide a filtered reference voltage signal, and a differential circuit having two inputs configured to be electrically connected to a resistance temperature detector (RTD). The differential circuit is operatively connected to the reference voltage source and has an RTD output configured to provide an RTD output signal represented by a voltage value when connected to the RTD.

In another embodiment, the system further comprises a processing device configured to receive the filtered reference voltage signal and the RTD output signal, and further configured to convert the filtered reference voltage signal and the RTD output signal to a temperature signal representative of a temperature experienced by the RTD.

In another embodiment, the RTD exists inside a housing of an energy storage system, and the reference voltage source, the differential circuit, and the processing device are disposed remotely from the RTD (i.e., outside the housing). The RTD may be connected to the rest of the system via a cable or other electrical connector.

In another embodiment, the system further comprises a thermal control unit disposed within the housing. The thermal control unit is configured to respond to a signal from the processing device to at least one of: increase a temperature in the housing if the temperature experienced by the RTD is below a determined lower threshold temperature value; or to decrease the temperature in the housing if the temperature experienced by the RTD is above a determined upper threshold temperature value. In an embodiment, the thermal control unit is configured to respond to the signal from the processing device to both increase and decrease the temperature as indicated.

In another embodiment, the system further comprises a comparison circuit coupled to the differential circuit and configured to receive an output value from differential circuit. The comparison circuit is connected to a heater in an energy storage device via a heater fail safe circuit. The comparison circuit is configured to output a signal to the heater fail safe circuit to disable the heater, if the output value of the differential circuit exceeds a set value.

In the specification and claims, reference will be made to a number of terms that have the following meanings. The singular forms "a", "an" and "the" include plural referents unless the context clearly dictates otherwise. Approximating language, as used herein throughout the specification and clauses, may be applied to modify a quantitative representation that could permissibly vary without resulting in a change in the basic function to which it is related. Accordingly, a value modified by a term such as "about" is not to be limited to the precise value specified. In some instances, the approximating language may correspond to the precision of an instrument for measuring the value. Moreover, unless specifically stated otherwise, a use of the terms "first," "second," etc., do not denote an order or importance, but rather the terms "first," "second," etc., are used to distinguish one element from another.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable.

This written description uses examples to disclose the invention, including the best mode, and also to enable one of ordinary skill in the art to practice the invention, including making and using a devices or systems and performing incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

What is claimed is:

1. A sensing circuit, comprising:
a first circuit configured to receive a reference voltage;
a second circuit configured to receive a resistance temperature detection (RTD) wire voltage from an RTD wire that is coupled with a resistance temperature detection (RTD) unit;
an amplification circuit configured to produce an analog output signal based at least in part on the reference voltage and the RTD wire voltage;
a filter element configured to filter the analog output signal produced by the amplification circuit;
an analog-to-digital converter (ADC) device configured to convert the filtered analog output signal to a digital signal output; and
a processor configured to determine a resistance of the RTD unit based at least in part on the digital signal, and further configured to control a thermal control unit of a battery,
wherein the determined resistance of the RTD unit is inversely proportional to the reference voltage and the RTD wire voltage.

2. The sensing circuit of claim 1, wherein the processor is further configured to process the digital signal as a non-linear voltage representation of a temperature of the battery.

3. The sensing circuit of claim 1, further comprising a voltage conditioner coupled to at least one of the first circuit, the second circuit, or the amplification circuit, wherein the voltage conditioner is configured to reduce noise and comprises at least one of a diode or a low pass filter.

4. The sensing circuit of claim 1, further comprising a comparison circuit coupled to at least one of the amplification circuit or the ADC device and configured to generate a signal for controlling a heater associated with the battery based at least in part on at least one of the analog output signal or the digital signal output.

5. A sensing circuit, comprising:
a resistance temperature detection (RTD) unit;
a primary voltage resistor coupled with the RTD unit and configured to receive a reference voltage;
a secondary voltage resistor configured to receive an RTD wire voltage from an RTD wire and that is coupled with the RTD unit;
a gain resistor configured to receive a secondary voltage value from the secondary voltage resistor and coupled to the secondary voltage resistor and an operational amplifier; and
a filter element configured to filter an analog output signal produced by the operational amplifier;
an analog digital converter (ADC) configured to convert the filtered analog output signal into a digital signal; and
a processor configured to determine a resistance of the RTD unit based on the digital signal,
wherein the determined resistance of the RTD unit is inversely proportional to the reference voltage and the RTD wire voltage.

6. The sensing circuit of claim 5, further comprising a voltage conditioner coupled to at least one of the RTD unit, the primary voltage resistor, the secondary voltage resistor, or the gain resistor, wherein the voltage conditioner is configured to reduce noise.

7. The sensing circuit of claim 6, wherein the primary voltage resistor and the secondary voltage resistor are connected to the operational amplifier via the gain resistor, wherein the operational amplifier is configured to provide an output signal representative of the reference and RTD wire voltages.

8. The sensing circuit of claim 7, wherein the processor is further configured to compensate for non-linearity characteristics introduced by the sensing circuit.

9. The sensing circuit of claim 8, wherein the processor is further configured to compare multiple non-linear RTD output signals to a static signal or to a variable set point signal, and thereby to obtain a logical output signal.

10. The sensing circuit of claim 9, wherein the processor is further configured to convert the RTD output signal and the reference voltage to a temperature signal representative of a temperature of a battery.

11. The sensing circuit of claim 9, wherein the processor is further configured to control a heating component for a battery based on the temperature signal.

12. The sensing circuit of claim 5, wherein the processor is further configured to process the digital signal as a non-linear voltage representation of a temperature of an energy storage system.

13. The sensing circuit of claim 5, further comprising a voltage conditioner that includes a filter having a resistance/capacitor configuration.

14. A system comprising:
a reference voltage source configured to provide a filtered reference voltage signal; and
a differential circuit having two inputs configured to be electrically connected to a resistance temperature detector (RTD), wherein the differential circuit is operatively connected to the reference voltage source and has an RTD output configured to provide an RTD output signal represented by a voltage value when connected to the RTD;
a filter element configured to filter the RTD output signal;
a processing device configured to determine a resistance of the RTD based on the filtered RTD output signal,
wherein the determined resistance of the RTD is inversely proportional to the reference voltage and the voltage value indicative of the RTD output signal.

15. The system according to claim 14, wherein the processing device is further configured to convert the filtered reference voltage signal and the filtered RTD output signal to a temperature signal representative of a temperature experienced by the RTD.

16. The system according to claim 15, wherein the RTD exists inside a housing of an energy storage system, and the reference voltage source, the differential circuit, and the processing device are disposed remotely from the RTD.

17. The system according to claim 16, further comprising a thermal control unit disposed within the housing, and the thermal control unit is configured to respond to a signal from the processing device to at least one of: increase a temperature in the housing if the temperature experienced by the RTD is below a determined lower threshold temperature value; or to decrease the temperature in the housing if the temperature experienced by the RTD is above a determined upper threshold temperature value.

* * * * *